United States Patent
Müller et al.

(10) Patent No.: US 11,092,653 B2
(45) Date of Patent: Aug. 17, 2021

(54) DETERMINATION OF THE INSULATION RESISTANCE OF A FUEL-CELL SYSTEM

(71) Applicant: Audi AG, Ingolstadt (DE)

(72) Inventors: Kai Müller, Bretzfeld (DE); Friedrich Wilhelm, Bad Wimpfen (DE); Stefan Längle, Renningen (DE)

(73) Assignee: AUDI AG, Ingolstadt (DE)

(*) Notice: Subject to any disclaimer, the term of this patent is extended or adjusted under 35 U.S.C. 154(b) by 235 days.

(21) Appl. No.: 16/353,944

(22) Filed: Mar. 14, 2019

(65) Prior Publication Data
US 2019/0293724 A1 Sep. 26, 2019

(30) Foreign Application Priority Data
Mar. 22, 2018 (DE) .................... 10 2018 204 378.7

(51) Int. Cl.
*G01R 31/389* (2019.01)
*G01R 31/374* (2019.01)

(52) U.S. Cl.
CPC ......... *G01R 31/389* (2019.01); *G01R 31/374* (2019.01)

(58) Field of Classification Search
CPC .. G01R 31/389; G01R 31/374; G01R 31/007; G01R 27/18; Y02E 60/50; H01M 2250/20; H01M 8/04305; Y02T 90/40; B60L 58/33; B60L 58/30
See application file for complete search history.

(56) References Cited

U.S. PATENT DOCUMENTS

| | | | |
|---|---|---|---|
| 7,662,496 B2 | 2/2010 | Fujita et al. | |
| 10,879,512 B2* | 12/2020 | Sun .................. | H01M 50/44 |
| 2005/0077364 A1 | 4/2005 | Hwang | |
| 2008/0197832 A1 | 8/2008 | Yokoyama | |
| 2009/0226769 A1* | 9/2009 | Ota .................. | H01M 8/04029 429/458 |
| 2011/0115490 A1* | 5/2011 | Klijn .................. | G01R 27/025 324/430 |
| 2013/0027049 A1* | 1/2013 | Sukup .................. | G01R 31/382 324/430 |
| 2014/0038070 A1* | 2/2014 | Papile .................. | H01M 8/04082 429/410 |
| 2015/0280294 A1* | 10/2015 | Shin .................. | B60L 58/26 429/50 |
| 2016/0377670 A1* | 12/2016 | Tamida .................. | G01R 31/52 324/551 |
| 2017/0102432 A1* | 4/2017 | Foley .................. | B60L 3/0053 |
| 2019/0148741 A1* | 5/2019 | Kucernak .............. | C09D 5/086 429/518 |
| 2019/0275527 A1* | 9/2019 | Hayes .................. | G05D 23/193 |

FOREIGN PATENT DOCUMENTS

| | | |
|---|---|---|
| DE | 101 28 836 A1 | 12/2002 |
| DE | 11 2004 001 059 B4 | 8/2007 |
| DE | 11 2005 002 361 T5 | 3/2009 |
| DE | 10 2014 017 422 A1 | 5/2016 |
| DE | 10 2015 215 790 A1 | 2/2017 |
| DE | 10 2016 119 015 A1 | 4/2017 |

* cited by examiner

*Primary Examiner* — Mohammad K Islam
(74) *Attorney, Agent, or Firm* — Seed Intellectual Property Law Group LLP

(57) ABSTRACT

The present disclosure relates to a method and a device for determining the insulation resistance of a fuel-cell system.

5 Claims, 2 Drawing Sheets

---

MEASURING AN INSULATION RESISTANCE $R_{ISO}$ OF THE HV SYSTEM TO GROUND

↓

FROM THE MEASURED INSULATION RESISTANCE $R_{ISO}$, BY WAY OF A COMPENSATION TERM $R_{BZKM\ Modell}(T, e^-)$, WHICH COMPENSATES FOR CHANGES IN THE CONDUCTIVITY OF THE FUEL-CELL COOLANT DUE TO TEMPERATURE CHANGES AND/OR CHANGES IN THE NUMBER OF IONS IN THE COOLANT AND/OR IN THE CONCENTRATION OF CONTAMINANTS IN THE COOLANT, DETERMINING A CORRECTED INSULATION RESISTANCE OF THE HV SYSTEM $R_{ISO\ korr}$ ACCORDING TO $$\frac{1}{R_{ISO\ korr}} = \frac{1}{R_{ISO}} + \frac{1}{R_{BZKM\ Modell}(T, e^-)}$$

MEASURING AN INSULATION RESISTANCE $R_{ISO}$ OF THE HV SYSTEM TO GROUND

FROM THE MEASURED INSULATION RESISTANCE $R_{ISO}$, BY WAY OF A COMPENSATION TERM $R_{BZKM\ Modell}(T, e^-)$, WHICH COMPENSATES FOR CHANGES IN THE CONDUCTIVITY OF THE FUEL-CELL COOLANT DUE TO TEMPERATURE CHANGES AND/OR CHANGES IN THE NUMBER OF IONS IN THE COOLANT AND/OR IN THE CONCENTRATION OF CONTAMINANTS IN THE COOLANT, DETERMINING A CORRECTED INSULATION RESISTANCE OF THE HV SYSTEM $R_{ISO\ korr}$ ACCORDING TO $$\frac{1}{R_{ISO\ korr}} = \frac{1}{R_{ISO}} + \frac{1}{R_{BZKM\ Modell}(T, e^-)}$$

FIG. 1

DETERMINATION OF THE INSULATION RESISTANCE OF A FUEL-CELL SYSTEM

CROSS-REFERENCE TO RELATED APPLICATION

This application claims priority to Germany Application No. 10 2018 204 378.7, filed Mar. 22, 2018, the entire contents of which are hereby incorporated by reference.

BACKGROUND

Technical Field

The present disclosure relates to a method and a device for determining the insulation resistance of a fuel-cell system.

Description of the Related Art

The traction batteries of electric and hybrid vehicles often have a rated voltage of several hundred volts—for example, 350 to 400 volts. It is therefore necessary to implement safety measures, in order to prevent the high voltage from endangering human life and vehicle components. Insulation faults can be the cause of uncontrolled fault currents strong enough to endanger lives, start fires, or cause other property damage. In vehicles, the insulation resistance of the HV system (high-voltage system) is therefore monitored periodically or continuously.

Various vehicle manufacturers have agreed upon a standard (LV123) for the safety of high-voltage technology in electric and hybrid vehicles. This standard specifies a threshold for the insulation resistance, which must be adhered to without fail. An insulation monitor regularly or continuously checks the insulation resistance between the HV circuit and the vehicle ground. If this falls below the predefined threshold value, fault messages will be issued, and parts of the system may be switched off.

Fuel-cells in fuel-cell vehicles have a cooling circuit to dissipate the waste heat of the system. This cooling circuit is filled with a liquid, very low conductivity fluid. The fluid is routed through the bipolar plates of the fuel-cell and thus contributes significantly to the insulation resistance of the system.

During fuel-cell operation, the conductivity of the cooling medium increases due to, among other things, heating, contamination influences, or other parameters. These effects can cause the measured insulation resistance to fall below the threshold value. This can lead to an unwanted system shutdown at the level of the entire vehicle, even though the HV system is in a safe state.

The maximum usable coolant temperature is therefore limited. This leads to a high system outlay; for example, a very large radiator is required. By limiting the operating range with regard to the operating temperature, system efficiency will, under certain circumstances, be adversely affected.

A device and a method for detecting an electrical loss for a fuel-cell are known from DE 11 2005 002 361 T5. The method measures a total electrical resistance of the fuel-cell while taking into account an electrical conductivity of a coolant. A voltage detection device detects the voltage applied to a coolant flowing in a fuel-cell. When the detected voltage is equal to or greater than a voltage threshold value, the occurrence of an electrical loss is established. The resistance value of the coolant in the fuel-cell is detected by a resistance value detection device. The threshold value of the voltage is increased if the detected resistance value of the coolant in the fuel-cell increases.

DE 11 2004 001 059 B4 discloses a fuel-cell cooling system and a method for controlling a circulation of coolant fluid in a fuel-cell. The method reduces heat generated in the cooling liquid by routing the coolant fluid through an ion exchanger into a cooling circuit, thereby reducing an electric current flow through the coolant and the heat generated thereby in the coolant.

US 2005/077364 A1 discloses a temperature and humidity controller for fuel-cells. The temperature controller measures an electrical resistance in a cooling circuit of the fuel-cell and then adjusts the coolant temperature.

BRIEF SUMMARY

The aim of embodiments of the present invention is to provide methods, systems and devices which eliminate at least some of the disadvantages mentioned in the background section above.

The aim is achieved by the methods, systems and devices disclosed herein, including the following embodiments:

1. A method for determining the insulation resistance of an HV system in a vehicle, which comprises a fuel-cell system cooled with a fuel-cell coolant, comprising: measuring an insulation resistance $R_{ISO}$ of the HV system to ground; and, from the measured insulation resistance $R_{ISO}$, by way of a compensation term $R_{BZKM\ Modell}(T,e^-)$, which compensates for changes in the conductivity of the fuel-cell coolant due to temperature changes and/or changes in the number of ions in the coolant and/or in the concentration of contaminants in the coolant, determining a corrected insulation resistance of the HV system $R_{ISO\ korr}$ according to:

$$\frac{1}{R_{ISO\,korr}} = \frac{1}{R_{ISO}} + \frac{1}{R_{BZKM\,Modell}\,(T,\,e^-)}.$$

2. A method for checking the operational safety of an HV system in a vehicle, which comprises a fuel-cell system cooled with a fuel-cell coolant, comprising: determining an insulation resistance $R_{ISO}$ of the HV system to ground; comparing the determined insulation resistance $R_{ISO}$ against a threshold value for the insulation resistance; and identifying an unsafe operating state of the HV system when the determined insulation resistance falls below the threshold value, wherein a corrected insulation resistance $R_{ISO\ korr}$ is used to judge whether the HV system is in a safe operating state, the corrected insulation resistance $R_{ISO\ korr}$ determined according to:

$$\frac{1}{R_{ISO\,korr}} = \frac{1}{R_{ISO}} + \frac{1}{R_{BZKM\,Modell}\,(T,\,e^-)},$$

wherein $R_{BZKM\ Modell}(T,e^-)$ is a compensation term, which compensates for changes in the conductivity of the fuel-cell coolant due to temperature changes and/or changes in the number of ions in the coolant and/or in the concentration of contaminants in the coolant.

3. A device for determining the insulation resistance of a HV system in a vehicle, which comprises a fuel-cell system cooled with a fuel-cell coolant, comprising: a fuel-cell controller, configured to determine, from a measured insulation resistance $R_{ISO}$ of the HV system, by way of a compensation term $R_{BZKM\ Modell}(T,e_-)$, which compensates for changes in the conductivity of the fuel-cell coolant due to temperature changes and/or changes in the number of ions in the coolant and/or in the concentration of contaminants in the coolant, a corrected insulation resistance of the HV system $R_{ISO\ korr}$ according to $$\frac{1}{R_{ISO korr}} = \frac{1}{R_{ISO}} + \frac{1}{R_{BZKM\ Modell}(T, e^-)}.$$

BRIEF DESCRIPTION OF THE SEVERAL VIEWS OF THE DRAWINGS

FIG. 1 provides a diagram of a method of determining the insulation resistance of an HV system in a vehicle, which comprises a fuel-cell system cooled with a fuel-cell coolant, according to one embodiment.

DETAILED DESCRIPTION

Figure 2:
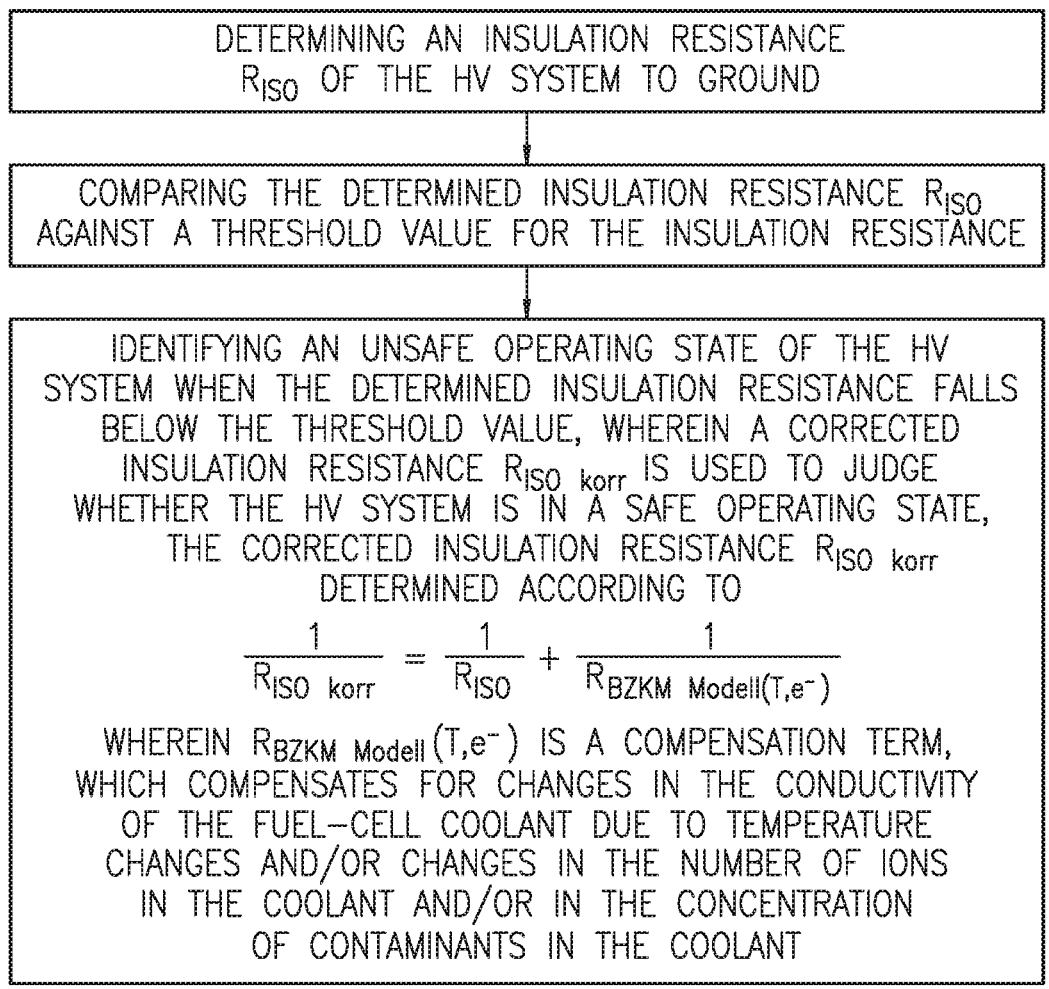
FIG. 2 provides a diagram of a method for checking the operational safety of an HV system in a vehicle, which comprises a fuel-cell system cooled with a fuel-cell coolant, according to one embodiment.

According to embodiments of the present invention, the insulation resistance is measured, as before, at the HV system level. In addition, the insulation resistance of the fuel-cell system is calculated on the basis of physical laws and empirically determined relationships. The actual insulation resistance of the overall system can be determined from the measured total resistance.

The subject matter of the invention, according to one embodiment, is a method for determining the insulation resistance of an HV system in a vehicle, which comprises a fuel-cell system cooled by using a fuel-cell coolant, as outlined in FIG. 1. An insulation resistance $R_{ISO}$ of the HV system to ground—in particular, the vehicle body—is measured first. From the measured insulation resistance $R_{ISO}$, a corrected insulation resistance of the HV system $R_{ISO\ korr}$ is determined by way of a compensation term $R_{BZKM\ Modell}(T, e^-)$, which compensates for changes in the conductivity of the fuel-cell coolant due to temperature changes and/or changes in the number of ions in the coolant and/or in the concentration of contaminants in the coolant.

The measured insulation resistance ($R_{ISO}$) of the overall system is composed of the electrical resistance of the HV system ($R_{HV\ Sys}$) and the electrical resistance of the fuel-cell system ($R_{BZ}(T,e^-)$), which depends upon the temperature T and the number of ions $e^-$ in the coolant or its level of contamination.

$$\frac{1}{R_{ISO}} = \frac{1}{R_{HV\ Sys}} + \frac{1}{R_{BZ}(T, e^-)}.$$

The electrical resistance of the fuel-cell system ($R_{BZ}(T, e^-)$) can be divided into a constant part $R_{BZ}$, traceable back to the fuel-cells themselves, and a variable part $R_{BZKM}(T,e^-)$, traceable back to the fuel-cell coolant and which depends upon the temperature T and the number of ions $e^-$ in the coolant or its level of contamination.

$$\frac{1}{R_{BZ}(T, e^-)} = \frac{1}{R_{BZ}} + \frac{1}{R_{BZKM\ Modell}(T, e^-)}.$$

Thus, $R_{BZKM}(T, e^-) = \rho(T, e^-) * \frac{l}{A}$ where ρ represents the specific resistance of the coolant, l represents the length of the coolant lines, and A represents the cross-section of the coolant lines in the fuel-cell system.

The measured insulation resistance ($R_{ISO}$) of the overall system is thus represented by the following formula:

$$\frac{1}{R_{ISO}} = \frac{1}{R_{HV\ Sys}} + \frac{1}{R_{BZ}} + \frac{1}{R_{BZKM}(T, e^-)}.$$

According to embodiments of the invention, a compensation term ($R_{BZKM\ Modell}(T,e^-)$) based upon physical relationships and empirical data is introduced in order to compensate for the dependence of the coolant resistance upon the temperature T and the number of ions $e^-$ in the coolant or its level of contamination.

The corrected insulation resistance of the overall system ($R_{ISO\ korr}$), which is used to judge whether the HV system is in a safe operating state, is given by $$\frac{1}{R_{ISO korr}} = \frac{1}{R_{HV\ Sys}} + \frac{1}{R_{BZ}} + \frac{1}{R_{BZKM}(T, e^-)} + \frac{1}{R_{BZKM\ Modell}(T, e^-)}.$$

The first three terms on the right represent the measured insulation resistance ($R_{ISO}$), which is composed of the electrical resistance of the HV system ($R_{HV\ Sys}$), the electrical resistance of the fuel-cells ($R_{BZ}$), and the electrical resistance of the fuel-cell coolant ($R_{BZKM}(T,e^-)$), which depends upon the temperature T and the number of ions $e^-$ in the coolant or its level of contamination.

The fourth term on the right-hand side represents a compensation term, ($R_{BZKM\ Modell}(T,e^-)$), based upon physical relationships and empirical data.

The subject matter of the invention, according to one embodiment, is also a method for checking the operational safety of an HV system in a vehicle, which comprises a fuel-cell system cooled by a fuel-cell coolant, as outlined in FIG. 2. The method comprises determining the insulation resistance of the HV system to ground—in particular, the vehicle body; comparing the determined insulation resistance against a threshold value for the insulation resistance; and identifying an unsafe operating state of the HV system when the determined insulation resistance drops below the threshold value.

According to the embodiment of the invention, the corrected insulation resistance $R_{ISO\ korr}$ determined according to the above-described method is used for judging whether the HV system is in a safe operating state.

The method according to the aforementioned embodiment of the invention offers the advantage that the insulation limits are widened, since the contribution to the insulation resistance of the entire HV system, which is dependent upon the temperature and the concentration of conductive particles in the fuel-cell coolant, is eliminated.

This leaves more leeway for higher coolant temperatures, which leads to a cost reduction in the radiator design. In addition, the operating conditions can be shifted towards higher temperatures, which brings with it advantages for the efficiency of the fuel-cell system. In addition, by widening the insulation limits during fuel-cell operation, the operability of the vehicle is stabilized because the system is prevented from being shut off when the conductivity of the coolant increases during operation of the fuel-cell. The method according to the aforementioned embodiment of the invention also prevents the vehicle from failing to start at a restart of the fuel-cell system, in which the insulation resistance is checked, and, if this falls below the insulation limit or threshold value, the vehicle is prevented from starting, since, according to the aforementioned embodiment of the invention, the influence of temperature and contamination of the coolant is compensated for.

The subject matter of the invention, according to one embodiment, is also a system or device for determining the insulation resistance of an HV system in a vehicle, which comprises a fuel-cell system cooled with a fuel-cell coolant. The system or device comprises a fuel-cell control unit configured to determine, from a measured insulation resistance $R_{ISO}$ of the HV system, by way of a compensation term $R_{BZKM\ Modell}(T,e^-)$, which compensates for changes in the conductivity of the fuel-cell coolant due to temperature changes and/or changes in the number of ions in the coolant and/or in the concentration of contaminants in the coolant, a corrected insulation resistance of the HV system $R_{ISO\ korr}$ according to:

$$\frac{1}{R_{ISOkorr}} = \frac{1}{R_{ISO}} + \frac{1}{R_{BZKM\ Modell}(T, e^-)}.$$

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for determining an insulation resistance of an HV system in a vehicle, which comprises a fuel-cell system cooled with a fuel-cell coolant, comprising:
   measuring an insulation resistance $R_{ISO}$ of the HV system to ground; and
   determining a corrected insulation resistance of the HV system $R_{ISO\ korr}$ from the measured insulation resistance $R_{ISO}$ and a compensation term $R_{BZKM\ Modell}(T,e^-)$, which compensates for changes in a conductivity of the fuel-cell coolant due to temperature changes and/or changes in a number of ions in the fuel-cell coolant and/or in a concentration of contaminants in the fuel-cell coolant, the determining the corrected insulation resistance of the HV system $R_{ISO\ korr}$ performed according to:

$$\frac{1}{R_{ISOkorr}} = \frac{1}{R_{ISO}} + \frac{1}{R_{BZKM\ Modell}(T, e^-)}.$$

2. The method of claim 1, wherein measuring the insulation resistance $R_{ISO}$ of the HV system to ground comprises measuring the insulation resistance $R_{ISO}$ of the HV system to a body of the vehicle.

3. A method for checking an operational safety of an HV system in a vehicle, which comprises a fuel-cell system cooled with a fuel-cell coolant, comprising:
   determining an insulation resistance $R_{ISO}$ of the HV system to ground;
   comparing the determined insulation resistance $R_{ISO}$ with a threshold value for the insulation resistance; and
   identifying an unsafe operating state of the HV system when the determined insulation resistance falls below the threshold value, wherein a corrected insulation resistance $R_{ISO\ korr}$ is used to judge whether the HV system is in a safe operating state, the corrected insulation resistance $R_{ISO\ korr}$ determined according to:

$$\frac{1}{R_{ISOkorr}} = \frac{1}{R_{ISO}} + \frac{1}{R_{BZKM\ Modell}(T, e^-)},$$

wherein $R_{BZKM\ Modell}(T,e^-)$ is a compensation term, which compensates for changes in a conductivity of the fuel-cell coolant due to temperature changes and/or changes in a number of ions in the fuel-cell coolant and/or in a concentration of contaminants in the fuel-cell coolant.

4. The method of claim 3, wherein determining the insulation resistance $R_{ISO}$ of the HV system to ground comprises determining the insulation resistance $R_{ISO}$ of the HV system to a body of the vehicle.

5. A device for determining an insulation resistance of an HV system in a vehicle, which comprises a fuel-cell system cooled with a fuel-cell coolant, comprising:
   a fuel-cell controller, configured to determine, from a measured insulation resistance $R_{ISO}$ of the HV system and a compensation term $R_{BZKM\ Modell}(T,e^-)$, which compensates for changes in a conductivity of the fuel-cell coolant due to temperature changes and/or changes in a number of ions in the fuel-cell coolant and/or in a concentration of contaminants in the fuel-cell coolant, a corrected insulation resistance of the HV system $R_{ISO\ korr}$ according to $$\frac{1}{R_{ISOkorr}} = \frac{1}{R_{ISO}} + \frac{1}{R_{BZKM\ Modell}(T, e^-)}.$$

* * * * *